(12) United States Patent
Stelzl et al.

(10) Patent No.: US 7,518,201 B2
(45) Date of Patent: Apr. 14, 2009

(54) METHOD FOR ENCAPSULATING AN ELECTRICAL COMPONENT, AND SURFACE ACOUSTIC WAVE DEVICE ENCAPSULATED USING SAID METHOD

(75) Inventors: Alois Stelzl, München (DE); Hans Krüger, München (DE); Gregor Feiertag, München (DE)

(73) Assignee: EPCOS AG, Munich (DE)

( * ) Notice: Subject to any disclaimer, the term of this patent is extended or adjusted under 35 U.S.C. 154(b) by 234 days.

(21) Appl. No.: 11/485,049

(22) Filed: Jul. 12, 2006

(65) Prior Publication Data

US 2006/0249802 A1  Nov. 9, 2006

Related U.S. Application Data

(62) Division of application No. 10/491,056, filed on Mar. 29, 2004, now Pat. No. 7,094,626.

(51) Int. Cl.
*H01L 29/84* (2006.01)
(52) U.S. Cl. .............. 257/416; 257/678; 257/E21.511; 310/340; 310/344
(58) Field of Classification Search ................ 438/106, 438/107, 108, 112; 257/778, E21.503, E21.511, 257/414, 416, 426, 678, 690; 313/313 R; 310/313 R, 340, 348
See application file for complete search history.

(56) References Cited

U.S. PATENT DOCUMENTS

| 6,124,636 | A | 9/2000 | Kusamitsu |
| 6,181,015 | B1 * | 1/2001 | Gotoh et al. ................. 257/778 |
| 6,351,194 | B2 * | 2/2002 | Takahashi et al. ........... 333/133 |
| 6,408,511 | B1 | 6/2002 | Branchevsky |
| 6,417,026 | B2 | 7/2002 | Gotoh et al. |
| 6,492,194 | B1 | 12/2002 | Bureau et al. |
| 6,528,924 | B1 * | 3/2003 | Stelzl et al. ............. 310/313 R |
| 6,649,446 | B1 * | 11/2003 | Goetz et al. ................. 438/110 |
| 6,722,030 | B1 | 4/2004 | Stelzl et al. |

FOREIGN PATENT DOCUMENTS

| EP | 0794 616 A2 | 9/1997 |
| JP | 2001 176995 | 7/1989 |
| JP | 2002 042499 A2 | 2/1990 |
| JP | 1 0168 041 | 6/1998 |
| WO | WO 99/43084 | 8/1999 |

* cited by examiner

*Primary Examiner*—Brook Kebede
(74) *Attorney, Agent, or Firm*—Schiff Hardin LLP

(57) ABSTRACT

An arrangement having a component mounted on a carrier in a flip chip construction which is encapsulated by a film, in particular a plastic film, laminated over the entire surface of the component. For additional sealing and mechanical stabilization, a plastic compound in liquid form is subsequently applied and hardened so as to surround the chip.

6 Claims, 3 Drawing Sheets

METHOD FOR ENCAPSULATING AN ELECTRICAL COMPONENT, AND SURFACE ACOUSTIC WAVE DEVICE ENCAPSULATED USING SAID METHOD

CROSS-REFERENCE TO RELATED APPLICATIONS

This Application is a divisional of parent application Ser. No. 10/491,056, filed Mar. 29, 2004 now U.S. Pat. No. 7,094,626. The parent application is herein incorporated by reference.

BACKGROUND OF THE INVENTION

A method for the hermetic encapsulation of a component is known, for example, from International Patent Publication No. WO 99/43084. There, components, in particular surface acoustic wave devices, are applied, using the flip chip technique, on a carrier that is provided with solderable terminal surfaces. The component is soldered on the carrier over bumps (solder balls), with a clearance from the carrier element, in such a way that the surface having the component structures is oriented towards the carrier.

For hermetic encapsulation of the components situated on the carrier, the components are finally covered and glued or laminated from the rear with a metal foil or a metal-coated plastic film on the carrier. Here, the film seals tightly between the components and seals tightly with the carrier around them, so that a hermetic encapsulation for the component structures results.

It has also been proposed to further stabilize and further hermetically seal the encapsulation by pressure application of, for example, a thermoplastic material, or through casting, for example with epoxy resin. Subsequently, the components can be separated by dividing the carrier plate.

It has turned out that the use of a metal foil, as well as the use of a metal-coated plastic film, for direct application on the rear side of a component involves problems, and can result in components whose hermetic sealing is not satisfactory. In addition, problems occur during the lamination process, because, in particular in the case of surface acoustic wave devices, the components have sharp edges, so that high demands are made both on the film and also on the laminating process for the manufacture of a hermetically sealed encapsulation. In particular, up to now it has been possible to carry out the method only by using thick and expensive special films.

SUMMARY OF THE INVENTION

The object of the present invention is to provide a method for encapsulating an electrical component that is technologically easy to execute, and in particular results in a mechanically stable encapsulation.

This object is achieved by a method for encapsulating an electrical component that includes a chip comprising component structures on its front side, comprising: mounting the component on a surface of a carrier in flip chip technique; connecting the component with electrical terminal surfaces that are present on the surface of the carrier, so that the front side of the chip is oriented towards the carrier and is situated at a distance therefrom; laminating a film onto an entire surface of the carrier, this surface being provided with the chip mounted thereon; and applying and hardening a plastic or resinous compound in liquid form so as to surround the component on the carrier.

This object is also achieved by a flip-chip mounted arrangement, comprising: a carrier; a component operating with acoustic waves, including at least one of a surface acoustic wave device, FBAR resonator, BAW resonator, and a filter made up of such resonators, mounted on the carrier, with a clearance thereto, in a flip chip arrangement by way of bump connections: an intermediate space between the component and the carrier that is sealed with a film in an area of a lower component edge, a plastic or resinous compound applied to a given height as a glob top covering at least around the component, wherein the plastic or resinous compound is removed down to a surface of the carrier along a strip surrounding the component.

DESCRIPTION OF THE DRAWINGS

In the following, the present invention is explained in more detail on the basis of exemplary embodiments and the associated Figures. All of the Figures are cross sectional views illustrating various method steps and structural relationships.

DETAILED DESCRIPTION OF THE PREFERRED EMBODIMENTS

Figure 1:
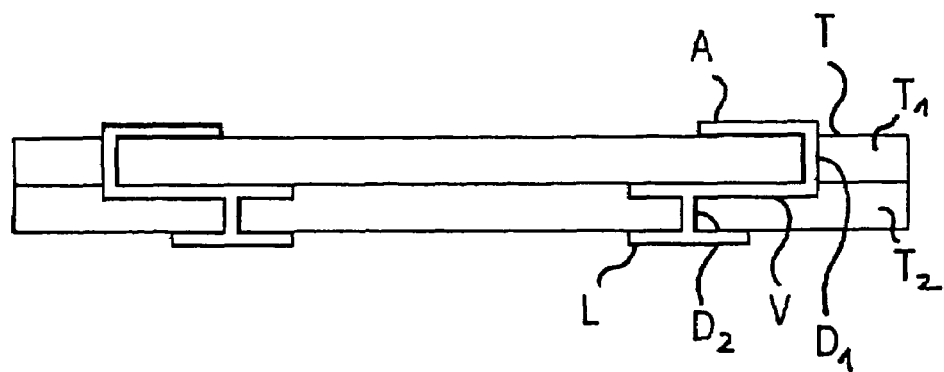
FIG. 1 is a cross section view showing an initial step indicating the carrier with terminals.

The underlying idea of the embodiments of the invention that a discussed below, for the encapsulation of electrical components mounted on a carrier using the flip chip technique, is first to laminate these components from the rear with a film, but without using an expensive special film. Rather, in a second step, a plastic/resinous compound is applied, in liquid form, on the carrier with the mounted component and the laminated-on film, in such a way that an inner contact, following at least the outer periphery of the component, is created of the plastic compound to the component, or to the film situated between these, as well as to the carrier, or to the film situated between these.

In this method, the film is used solely to seal the clearance between the component (chip) and the carrier along the edges of chip, in such a way that the plastic compound applied in liquid form cannot penetrate into the intermediate space, housing the component structures, between the chip and the carrier. The plastic compound, applied as a glob top covering, can thereby simultaneously fulfill a plurality of functions. It fixes the component applied on the carrier, protects it against mechanical effects, and can already represent in itself a sufficient sealing of the component, in particular against penetrating moisture and/or other contaminants.

In a further embodiment of the present invention, after hardening, the liquid-to-viscous plastic compound is cut by sawing around the chip in an annular fashion until the surface of the carrier is exposed there. In this way, an annular trench is produced. This sawing takes place at a given distance from the outer edge of the component so that a sufficiently wide or thick glob top covering remains there.

Due to the exposure of the carrier in the trench, it is possible to apply a metal layer over the glob top covering for the further sealing of the component, insuring a still higher degree of tightness for the component. The tight seal of the metal layer with the carrier is achieved through the exposure of the carrier surface in annular fashion around the chip. In this way, a hermetic encapsulation of the component is achieved, whereby the metal layer simultaneously provides an RF shielding for the component. This RF shielding can prevent a sensitive component against external radiation, or can prevent the emission of undesirable radio-frequency radiation from a component that operates at a radio frequency. The thickness of the metal layer to be deposited is selected dependent on the desired purpose. A hermetic sealing is possible already with a thin closed metal layer, while a sufficient degree of RF shielding requires a greater layer thickness.

Even without additional metallization, an improved sealing of the component is achieved if a direct contact can be produced both between the glob top covering and the component, and also between the glob top covering and the carrier. For this purpose, in a further embodiment of the present invention, before the application of the plastic compound, the film is removed in the region of a closed strip around the chip. The distance of the strip from the periphery of the chip is chosen such that a lamination edge always remains between the strip and the chip, in which the film is connected to the carrier.

After the application of the glob top covering, in this way an inner contact of the plastic compound with the carrier can be produced in the area of the circumferential strip. This results in a better adhesion of the glob top covering to the carrier, as well as a sealing of a finer gap that may still be present between the film and the carrier. This latter gap can occur particularly at points at which the film covers raised structures on the carrier, and an inner form-fitting contact between the film, the structures, and the carrier can be achieved only with difficulty.

In contrast, the sealing between the glob top covering and the film is possible without difficulty given a suitable combination of materials of the film and the plastic compound. The adhesion of the plastic compound to the film also presents no problems.

In a further embodiment of the present invention, a further-improved sealing of the component against the penetration of external influences is achieved without additional metallization, if in addition a direct contact can be produced between the glob top covering and the component or chip. For this purpose, before the application of the plastic compound, the film is removed on the side walls of the chip, for example, inside a strip-shaped region running around the chip on the lateral surfaces of the chip.

In this way, after the application of the plastic compound it is possible to seal a further potential lack of tightness of the encapsulated component. Both the better adhesion and also the form-fitting inner contact between the adhesive compound and the chip itself are preferred with respect to tightness, in comparison with the connection between the chip and the film. Advantageously, both strip-shaped structurings on the carrier and on the lateral surfaces of the chip are used to seal the glob top covering against the chip and the carrier.

The method can be used for any electrical components, but is advantageously used for components bearing sensitive component structures on a surface. In particular, it is suitable for components whose component structures must not be covered, as is the case, for example, for surface acoustic wave devices and other components that operate with an acoustic wave, such as FBAR resonators or BAW components.

In these cases, a covering would result in modifications of the component characteristics that would be impermissible or incapable of being precisely reproduced. For such components, the flip chip assembly technique is therefore preferred, in which the component structures are oriented towards the carrier, and are situated securely in the intermediate space between the chip and the carrier. With the encapsulation according to various embodiments of the present invention, a hermetic sealing for these components is additionally achieved that can be adjusted in its effectiveness. Here, the flip chip technique means that the component is mounted on the carrier, for example, over bumps, i.e., with the aid of soldered connections.

Preferably, the electrical contacting of the component takes place simultaneously via the bumps, so that solderable electrical terminal surfaces for the bumps are provided both on the chip and on the carrier. Correspondingly, the carrier has printed conductors, and is preferably constructed in at least two layers, whereby a wiring layer can then be situated between the two layers. Electrical terminals for the encapsulated component are then situated on the lower side of the carrier, on which no components have been situated. The different planes containing printed conductors are thereby connected with one another via through-connections/feedthroughs.

Preferably, an encapsulated component according to embodiments of the present invention comprises no through-connections that lead in a line through all the layers of the carrier as a whole. The through-connections are therefore preferably offset from one another from one layer to the next, so that leaks due to through-connections through the carrier that may not be completely closed are excluded.

For the carrier, a mechanically and electrically matched material, or a combination of such materials, is suitable. These preferably comprise sufficient mechanical strength, and are preferably hermetically sealed against gases and moisture. Suitable materials for the carrier include, for example, aluminum oxide, glass, HTCC, LTCC, or organic carriers, such as PCB or film materials such as Kapton[7] or Mylar[7]. In order to enable a reliable contacting, for example by way of bumps, even given increasing miniaturization of the components, an LTCC ceramic is advantageous, this ceramic having a geometry of the metallizations that is precisely determinable beforehand due to its low degree of contraction when baked. While carriers made of organic materials can likewise be manufactured with an exact geometry, they are less sealed against environmental influences.

In comparison with known methods requiring high-quality films for the covering of the components, the method according to the present invention can be carried out securely with a variety of conventional films, including even thin films. Thermoplastic or duroplastic films can be used. The films can be in the B-stage, whereby a thickness of approximately 1-10 μm is advantageous. A thicker film is possible, but is not required, and would require a higher expense for the selective deposition in the subsequent structuring, and would result in a stronger coupling between the component and the film. This is undesirable, at least in the case of OFW components and for FBAR resonators.

The film preferably has as an important characteristic a capacity for lamination, and is therefore sticky and deformable, or extensible, under the effect of heat treatment that may be applied. Well-suited materials include, for example, films made of Mylar[7], in a thickness of approximately 1 µm. For the lamination, the film can be softened by heat, and can thereby be brought into a stickier state. It is also possible to use adhesive films that are coated on one side with an adhesive or a correspondingly acting material.

The lamination takes place under pressure and increased temperature. In order to achieve a particularly good form-fitting seal between the film, the carrier, and the component, the space between the film and the carrier is evacuated. The normal air pressure over the film is sufficient to press this film tightly onto the carrier, together with the component mounted thereon.

For the method, here it is not critical if local damage of the film occurs at sharp-edged chip surfaces that may be present. For the method according to embodiments of the present invention, this does not present a risk, because the seal is achieved independent of the tightly applied film. The laminating method, which operates solely with pneumatic pressure and partial vacuum, can be supported by infrared radiators, so that the laminating process as a whole can be carried out almost without contact.

After the lamination, the application of the plastic compound can take place immediately in order to produce a glob top covering. The plastic compound is thereby applied in liquid form, the desired degree of viscosity being achieved by heating to a suitable temperature. The application can take place using a simple dispenser, for example by dripping or pouring. To the extent that the plastic compound can be prevented from running due to a suitably high degree of viscosity, it is sufficient to apply the resinous material around the chip so that it lies in form-fitting fashion on the outer edges of the chip and on the carrier, and naturally forms a form-fitting connection with the film that may be situated between these.

In a preferred specific embodiment of the present invention, a plurality of components are mounted on the same carrier, and are separated after the encapsulation has been produced by dividing the carrier. In this case, the application of the plastic compound can take place over the entire surface, up to a desired height. The minimum height for the glob top covering is thereby the spacing between the carrier and the chip, in addition to a safety region in which the glob top covering overlaps the chip. It is also possible and advantageous to apply the glob top covering up to the height of the chip upper surface, or slightly higher than this.

Besides the application of the plastic compound onto an unstructured film lying on the whole surface, it is also possible, as mentioned above, to structure the film in such a way that the surface of the chip and the carrier is exposed in desired sub-areas. The structuring thereby preferably takes place in such a way that the film is removed at least in the area of two strips, already mentioned above. This can, for example, take place using a laser. Here, the laser can be guided over the carrier or over the film so as to follow the desired structuring lines.

Besides the strip-type removal of regions of film, it is also possible to remove additional regions of film, for example, on the rear side of the chip outside the external strip, which is closed around the chip in the manner of a frame. Here, it is always important that the clearance between the lower edges of the chip and the carrier remain sealed by a strip of film having a sufficiently broad lamination edge both on the chip and also on the carrier.

In addition, it is, for example, also possible to use a film that can be brought into a chemically and physically more stable form with the aid of radiation, for example, in the manner of a photoresist. In this way, a film laminated over the entire surface can be hardened by radiation in the area that is later to remain on the component, or on the arrangement of the component and the carrier. The remaining non-hardened regions can then be removed in a second step, for example with the aid of a plasma, particularly a plasma containing oxygen.

In the case of the structured film as well, the plastic compound is subsequently applied as described. Due to the direct contact, made possible by the structuring, between the plastic compound and the chip and between the plastic compound and the carrier, this compound becomes a tightly applied, self-adhesive sealing ring.

Preferably, as a plastic compound a reaction resin that can be hardened thermally is applied, for example an epoxy resin. Besides having sufficient mechanical strength, the plastic compound is preferably optimized in such a way that its thermal expansion characteristic is matched to that of the bump connections, and preferably agrees approximately therewith. In this way, it is ensured that temperature fluctuations cannot cause stresses due to different thermal expansions, so that neither the glob top covering compound nor the bump connections are stressed thereby. The matching of the expansion coefficients preferably takes place with the aid of inorganic filling materials, with which the hardened reaction resin compound can for example be set to a thermal expansion coefficient of approximately 22 ppm/K. This corresponds precisely to the expansion coefficient of a known material used for bump connections.

After the hardening of the plastic compound, the glob top covering is sawed around the chip or chips, so that the surface of the film or the carrier surface is exposed. The sawing takes place in such a way that a sufficiently broad glob top edge, sealing with the carrier or with the film situated thereon, remains around the chip. As long as only the film is exposed, this film can be removed in an additional step, for example through the action of a plasma.

It is also possible to carry out the sawing into the carrier. The sawing can, on the one hand, support the separation of a plurality of components that during use are mounted on a common carrier. The exposure of the surface of the carrier in the sawed areas can, however, also be used to produce a tight contact with an additional covering layer, in particular the metallization already mentioned.

Here, the metallization can be produced in a plurality of stages, and with correspondingly different methods. A base metallization for supporting the adhesion can be produced with a small layer thickness, for example, by sputtering. Nickel and chromium are, for example, suitable for this purpose. The base metallization can also take place through currentless deposition, for example, from a suitable bath containing copper.

The reinforcement of the base metallization up to the desired thickness then preferably takes place in a galvanic process, but can likewise be carried out without current. Copper is in particular suitable for thickening the base metallization. A terminating metal layer, for example, a covering layer made of nickel or gold, can be applied in order to produce solderability or resistance to oxidation.

Alternatively, other metallization methods can also be used. Nickel, or another magnetic metal, is used in particular if the component covering is intended simultaneously to provide a shielding against electromagnetic fields. In a further construction of the present invention, an electrically conductive glob top covering is used that contains, for example, conductive particles. The galvanic deposition of a metal suitable for the metallization can now take place directly on this covering, so that here it is not necessary to carry out a two-stage metallization.

As mentioned, the metallization can be used for RF shielding. For this purpose, it is advantageous to connect the metallization with a ground terminal on the rear side of the chip or on the surface of the carrier. Preferably, for this purpose, an electrical terminal surface on the carrier, with which the metallization can be contacted, is exposed during the sawing.

If a plurality of components has been mounted and encapsulated in parallel on a common carrier, these components can now be separated in this phase. However, it is also possible to use the method according to the present invention for the encapsulation of a plurality of possibly different components on a common carrier that can subsequently remain on the carrier, and which, for example, represent a module. Besides its simplified, economical execution, the method according to the present invention is also distinguished by a low constructive height, because the tightness and mechanical strength ensured by the present invention are achieved already with a low height of the glob top covering. In known methods, the encapsulation is, for example, completed by spraying with a thermoplastic material, which results in significantly greater constructive heights.

The examples shown in the Figures are based on a carrier T (FIG. 1), which here is fashioned in two layers, having sub-layers T1 and T2. On the surface of the carrier there are situated terminal metallizations A for connection with the component structures. On the underside of the carrier there are situated solderable terminal surfaces L that are suitable for contacting with an external circuit environment. Between the sub-layers T1 and T2 there is situated a wiring plane V, while the different metallization planes are connected via through-connections.

Figure 2:
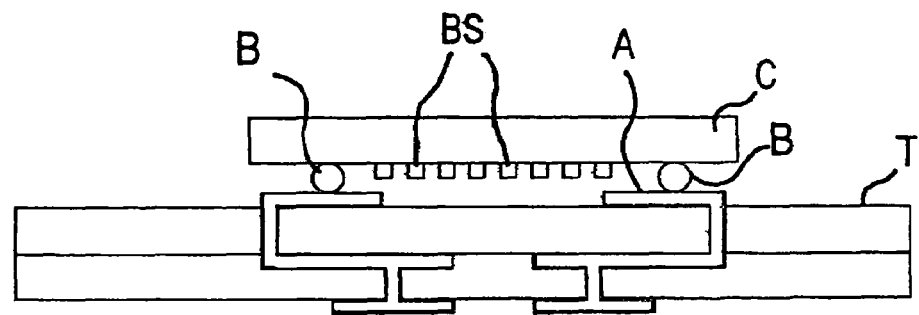
FIG. 2 is a cross section view showing the addition of a chip having bump connections and component structures on it.

FIG. 2 shows how, with the aid of bumps, a component (chip) is now soldered onto the carrier T in the flip chip assembly technique. With the aid of bump connections B, simultaneous component structures BS on the front side of a chip C are contacted electrically with terminal metallizations A on the carrier T.

Figure 3:
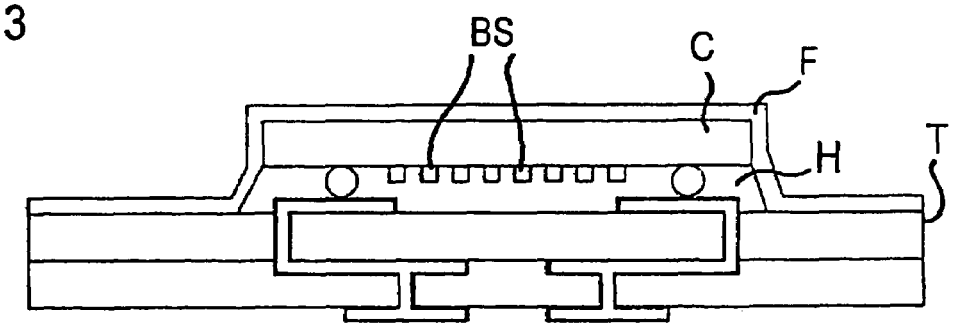
FIG. 3 is a cross section view showing the addition of film.

FIG. 3 shows that a film F is now laminated onto the overall surface of the carrier T and of the chip C in such a way that this film lies tightly both on the lateral walls and also on the rear side of the chip C. In this way, the component structures BS are situated in a hollow space H that is primarily formed by the surface of the carrier T and of the front side of the chip C, and at the lateral limit of the film F.

Figure 4:
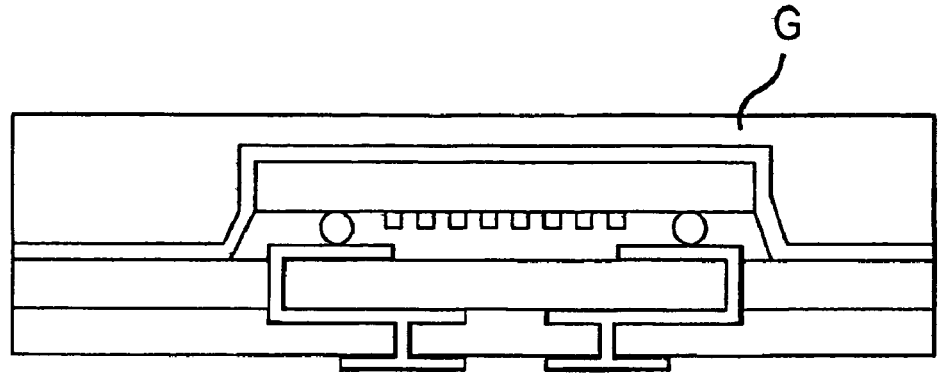
FIG. 4 is a cross section view showing the addition of a glob top covering.

FIG. 4 shows that a plastic compound is now applied over the entire arrangement in order to form a glob top covering G, for which a filling height over the surface of the carrier T is selected that extends beyond the upper edge of the chip. However, lower filling heights are also possible.

Figure 5:
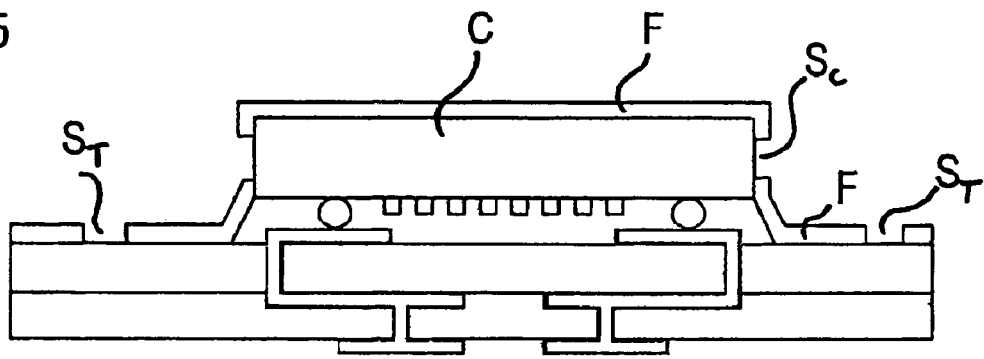
FIG. 5 is a cross section view showing an embodiment having a strip/structuring line before the addition of a glob top covering.

FIG. 5 shows a possible structuring of the film F before the application of the plastic compound. In a first strip $S_T$ at a distance from the chip C, the film F is thereby removed around the chip in the manner of a frame, following the outer edge of the chip, for example, using a laser. A second structuring line $S_C$, to be carried out optionally, is situated on the lateral walls of the chip. Here as well, the film F is removed in a strip running around the entire chip C. The second structuring line $S_C$ can also include the rear side of the chip, or can run exclusively on the rear side of the chip.

Alternatively, the entire rear side of the chip may be exclusively exposed. Subsequently, the glob top covering G is applied in such a way that it stands in contact with the chip C, at least in the area of structuring strip $S_C$, and stands in contact with the surface of the carrier T in the area of structuring strip $S_T$. Alternatively, instead of the glob top covering G, a metallization can also be applied directly on the arrangement that is shown in FIG. 5, or, alternatively, applied to the structured on the rear side.

Figure 8:
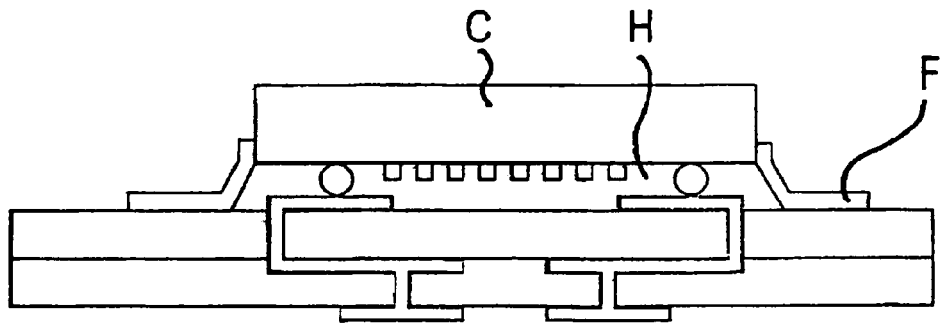
FIG. 8 is a cross section view showing an embodiment in which the covering is removed except for a portion covering the hollow area.

FIG. 8 shows a further possible structuring of the film F, in which the overall film is removed down to a strip of a suitable width such that the hollow space H remains sealed, and a penetration of plastic compound during the later covering is prevented. As an alternative to the covering with the plastic compound (e.g., glob top covering), a metallization can be applied directly over the arrangement shown in FIG. 8.

Figure 6:
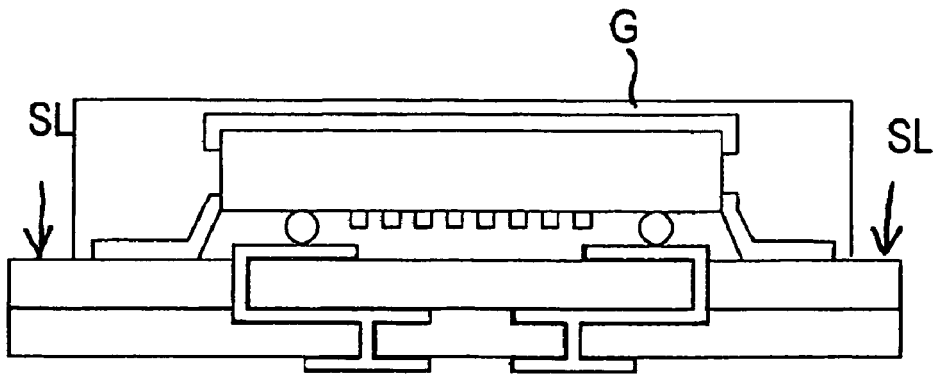
FIG. 6 is a cross section view showing the addition of structuring lines.

FIG. 6 shows how, after the preferably thermal hardening of glob top compound G, in a further structuring step, the surface of the carrier T is exposed in the area of the structuring lines $S_L$, for example, by sawing into the glob top compound G. Here, the structuring line $S_L$ is preferably selected such that it is situated further from the chip C than is the structuring line $S_T$. In this way, it is ensured that even after the sawing, a sufficient boundary surface remains between the glob top covering G and the surface of the carrier T. FIG. 6 shows the arrangement after the sawing.

Subsequently, a metallization M can be applied over the entire surface, for example, with a layer thickness of 10 μm. Metallization M thereby seals with the surface of the carrier T in the area of the structuring line $S_L$. Because the structuring line $S_L$ is sealed around the chip C in the manner of a frame, in this way a metallic covering closed on all sides results that seals all around with the carrier T. It lies tightly on the glob top compound, if the filling height has been selected higher than the rear side of the chip. In the case of lower filling heights of the glob top compound G, the metallization M can also lie against the film F, or, in the case of a structuring according to FIG. 8, can also lie against the rear side of the chip C.

Figure 7:
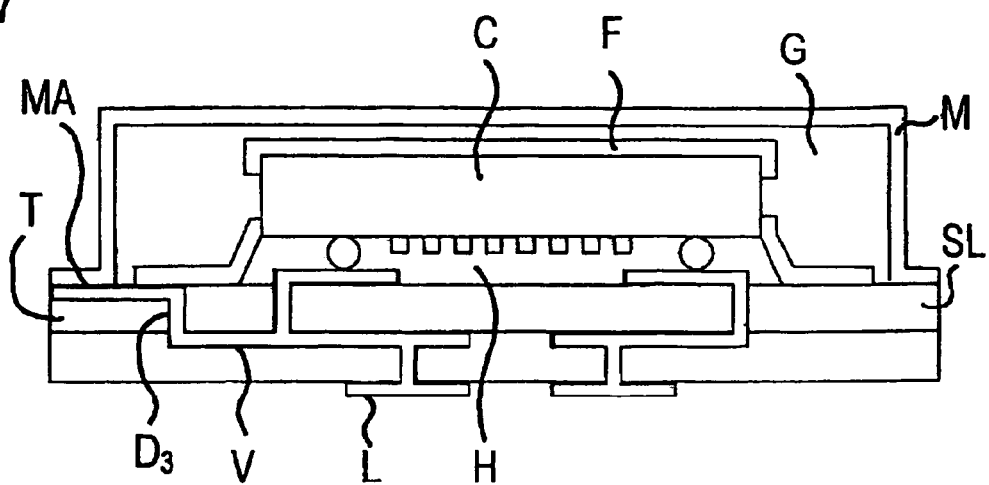
FIG. 7 is a cross section view showing the addition of the metalization layer.

A further construction of the present invention is shown in FIG. 7. In order to improve the RF shielding of the metallization M, this metallization is connected electrically with ground. For this purpose, on the surface of the carrier T a ground terminal MA is created that is connected, via a through-connection $D_3$, with a wiring plane in the interior of the multilayer carrier T, and is connected via another through-connection with an external solder terminal L.

Preferably, in this specific embodiment, the through-connection $D_3$ is realized such that it is made either inside the hollow space H between the front side of the chip C and the carrier surface or is made in a lamination area of the film F that remains covered even after the removal of the film in the area of the structuring line ST by a remaining strip of film laminated onto carrier T. In this way, a penetration of the plastic compound for the glob top covering G into through-connection $D_3$ is prevented.

The Figures indicate the present invention only schematically, in order to enable better explanation of the present invention. The drawings are therefore not to scale, and also indicate the outer geometry only schematically. The present invention is also not limited to the details shown in the Figures, but rather also comprises the already-mentioned possible variations, as well as additional specific embodiments that are conceivable within the scope of the Claims. The particular implementations shown and described herein are illustrative examples of the invention and are not intended to otherwise limit the scope of the invention in any way. For the sake of brevity, conventional aspects and structures may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

The invention claimed is:

1. A flip-chip mounted arrangement, comprising:
   a carrier;
   a component operating with acoustic waves, including at least one of a surface acoustic wave device, a film bulk acoustic resonator (FBAR) a bulk acoustic wave resonator (BAW), and a filter made up of at least one of the film bulk acoustic resonator (FBAR) or the bulk acoustic wave resonator (BAW), mounted on the carrier with a clearance thereto in a flip-chip arrangement by way of bump connections;
   an intermediate space between the component and the carrier that is sealed with a film in an area of a lower component edge; and
   a plastic or resinous compound applied to a given height as a glob top covering at least around the component, wherein the plastic or resinous compound is removed by sawing to create vertical sidewalls down to a surface of the carrier along a strip surrounding the component.

2. The component as recited in claim 1, further comprising:
   a metallization in a form of a thin metal layer situated directly over the film.

3. The component as recited in claim 1, further comprising:
   a metal layer deposited over an entire surface over the component, covering the plastic compound, the metal layer sealing with the surface of the carrier in the region of the strip.

4. The component as recited in claim 2, wherein on both sides of a strip-shaped segment of film surrounding the component, the plastic or resinous compound seals on the one hand with a surface of the component, and seals on the other hand with a surface of the carrier.

5. The component as recited in claim 1, wherein a thermal coefficient of expansion of the plastic compound is matched to that of the material of the bump connection.

6. A flip-chip mounted arrangement, comprising:
   a carrier;
   a component operating with acoustic waves, including at least one of a surface acoustic wave device, a film bulk acoustic resonator (FBAR), a bulk acoustic wave resonator (BAW), and a filter made up of such resonators mounted on the carrier with a clearance thereto in a flip-chip arrangement by way of bump connections;
   an intermediate space between the component and the carrier that is sealed with a film in an area of a lower component edge;
   a plastic or resinous compound applied to a given height as a glob top covering at least around the component, wherein the plastic or resinous compound is removed down to a surface of the carrier along a strip surrounding the component;
   a thermo coefficient of expansion of the plastic compound being matched to that of a material of the bump connection; and
   the glob top covering comprising a plastic compound filled with an inorganic filling material.

* * * * *